United States Patent
Iwabuchi et al.

(10) Patent No.: US 7,859,138 B2
(45) Date of Patent: Dec. 28, 2010

(54) DRIVE CIRCUIT

(75) Inventors: Akio Iwabuchi, Niiza (JP); Masato Hara, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 404 days.

(21) Appl. No.: 11/993,043

(22) PCT Filed: May 1, 2006

(86) PCT No.: PCT/JP2006/309102

§ 371 (c)(1),
(2), (4) Date: Dec. 19, 2007

(87) PCT Pub. No.: WO2006/137221

PCT Pub. Date: Dec. 28, 2006

(65) Prior Publication Data

US 2010/0052648 A1    Mar. 4, 2010

(30) Foreign Application Priority Data

Jun. 24, 2005   (JP) .................... P2005-184872

(51) Int. Cl.
*H01F 27/42* (2006.01)
(52) U.S. Cl. .................................... 307/412
(58) Field of Classification Search ........... 308/412
See application file for complete search history.

(56) References Cited

U.S. PATENT DOCUMENTS 4,316,243 A * 2/1982 Archer ...................... 363/132

FOREIGN PATENT DOCUMENTS

| JP | 61 161967 | 7/1986 |
|---|---|---|
| JP | 2 49388 | 4/1990 |
| JP | 5 41397 | 6/1993 |
| JP | 10 285949 | 10/1998 |

* cited by examiner

*Primary Examiner*—Robert L. DeBeradinis
(74) *Attorney, Agent, or Firm*—Oblon, Spivak, McClelland, Maier & Neustadt, L.L.P.

(57) ABSTRACT

A drive circuit for a switching circuit has a high-side drive circuit to turn on/off, according to a control signal, a switching element QH arranged on a high side of a DC power source Vin and a low-side drive circuit to turn on/off alternately with the switching element QH according to the control signal a switching element QL arranged on a low side of the DC power source and connected in series with the switching element QH. Ends of an auxiliary power source Vcc1 are connected in series with a switch element Qn1, a capacitor C1, and a switch element Qn2. Both ends of the capacitor C1 are connected in series with a switch element Qp1, a capacitor C2, and a switch element Qp2. A control circuit alternately turns on/off the switch elements Qn1 and Qn2 and the switch elements Qp1 and Qp2. The capacitor C2 provides the high-side drive circuit with source power.

9 Claims, 5 Drawing Sheets

DRIVE CIRCUIT

TECHNICAL FIELD

The present invention relates to a drive circuit of a switching circuit used for a DC-DC converter, an inverter, a motor drive circuit, and the like.

BACKGROUND TECHNOLOGY

A switching circuit used for a DC-DC converter and the like alternately turns on/off, according to a control signal, two switching elements connected in series between both ends of a DC power source, to supply power to a load connected at an intermediate point of the two switching elements. To drive the switching element connected to a high side of the DC power source, the switching circuit requires a dedicated power source. To form this power source, conventionally known is a drive circuit using a bootstrap circuit.

Figure 1:
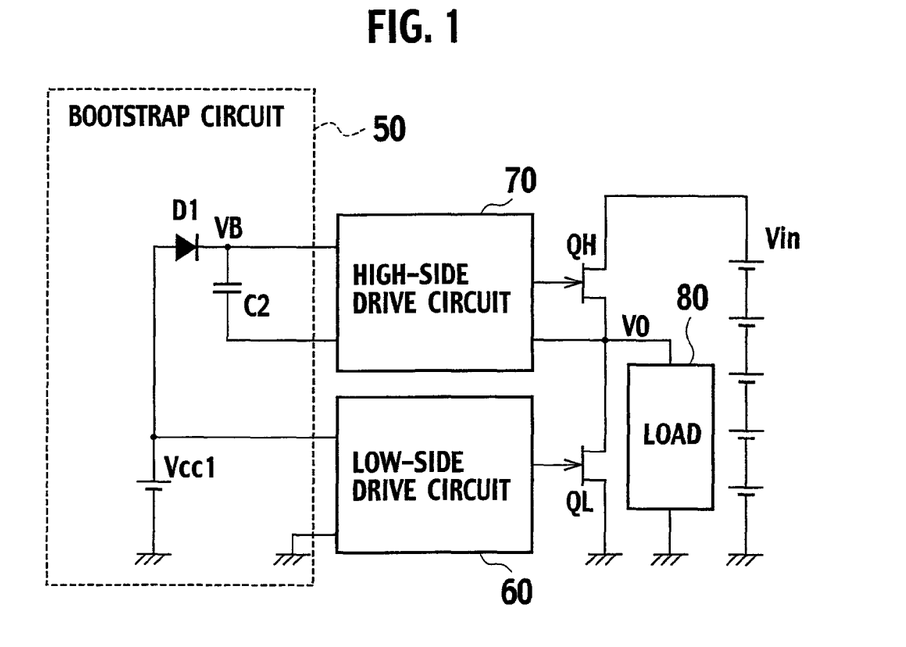
FIG. 1 is a circuit diagram showing a drive circuit employing a conventional bootstrap circuit.

FIG. 1 is a circuit diagram showing a drive circuit using a bootstrap circuit. In FIG. 1, a MOSFET as a switching element QH and a MOSFET as a switching element QL are connected in series between both ends of a DC power source Vin. A connection point of the switching element QH and switching element QL is connected to a load 80.

A low-side drive circuit 60 turns on/off the switching element QL according to a signal from a control circuit that is not shown. According to a signal from the not-shown control circuit, a high-side drive circuit 70 turns on/off the switching element QH complementarily to the switching element QL. Namely, the control signals alternately turn on/off the switching element QH and switching element QL.

The low-side drive circuit 60 operates with an auxiliary power source Vcc1. The high-side drive circuit 70 operates with the voltage of a capacitor C2 that is charged by the bootstrap circuit 50 including a diode D1 and the capacitor C2.

Operation of the drive circuit of such a configuration will be explained. Here, charging the capacitor C2 serving as a power source for operating the high-side drive circuit 70 will be explained.

A control signal turns on the switching element QL, and then, the auxiliary power source Vcc1 passes a current through a path along the diode D1, the capacitor C2, the connection point V0 of the switching elements QH and QL, the switching element QL, and a ground GND, to charge the capacitor C2.

Then, the control signal turns off the switching element QL to increase a potential at the connection point V0. This increases a reference potential for the capacitor C2 and high-side drive circuit 70 and the voltage of the charged capacitor C2 operates the high-side drive circuit 70.

Figure 2:
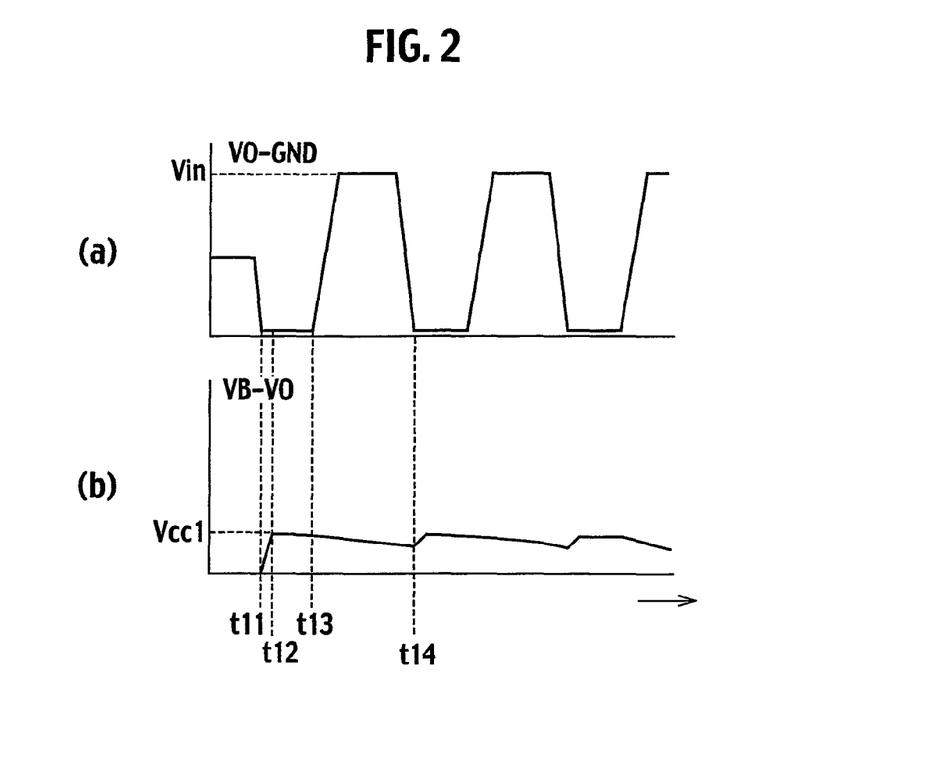
FIG. 2 is a timing chart explaining operation of the drive circuit shown in FIG. 1.

FIG. 2 is a timing chart explaining operation of the drive circuit shown in FIG. 1. FIG. 2(a) shows a voltage V0-GND between the connection point V0 and the ground GND and FIG. 2(b) shows a voltage VB-V0 of the capacitor C2. When the switching elements QH and QL are in an OFF state, the voltage V0-GND is about a half the DC power source voltage Vin due to division by floating capacitance of the switching elements and the like. The capacitor C2 has no charge, and therefore, the voltage VB-V0 is nil.

At time t11, the switching element QL turns on and the voltage V0-GND becomes nearly zero. At this time, the capacitor C2 is charged by the auxiliary power source Vcc1 through the path along the diode D1, capacitor C2, connection point V0 of the switching elements QH and QL, switching element QL, and ground GND, to rapidly increase the potential thereof. At time t12, the capacitor C2 is charged to a voltage equal to the voltage of the auxiliary power source Vcc1.

At time t13, the switching element QL turns off and the high-side drive circuit 70 that is operable with the voltage VB-V0 of the capacitor C2 turns on the switching element QH. As a result, the voltage V0-GND increases to the input voltage Vin and the voltage VB-V0 of the capacitor C2 decreases because the charge of the capacitor C2 is consumed by the high-side drive circuit 70 to turn on the switching element QH.

At time t14, the switching element QH turns off and the switching element QL turns on to again charge the capacitor C2. These actions repeat to alternately turn on/off the switching elements QH and QL.

A gate drive circuit related to the drive circuit shown in FIG. 1 is disclosed in, for example, Japanese Unexamined Patent Application Publication No. 2004-304527. The gate drive circuit described in this document combines a bootstrap circuit with a charge pump drive circuit to provide a power source for a drive circuit of a high-side switching element.

Figure 3:
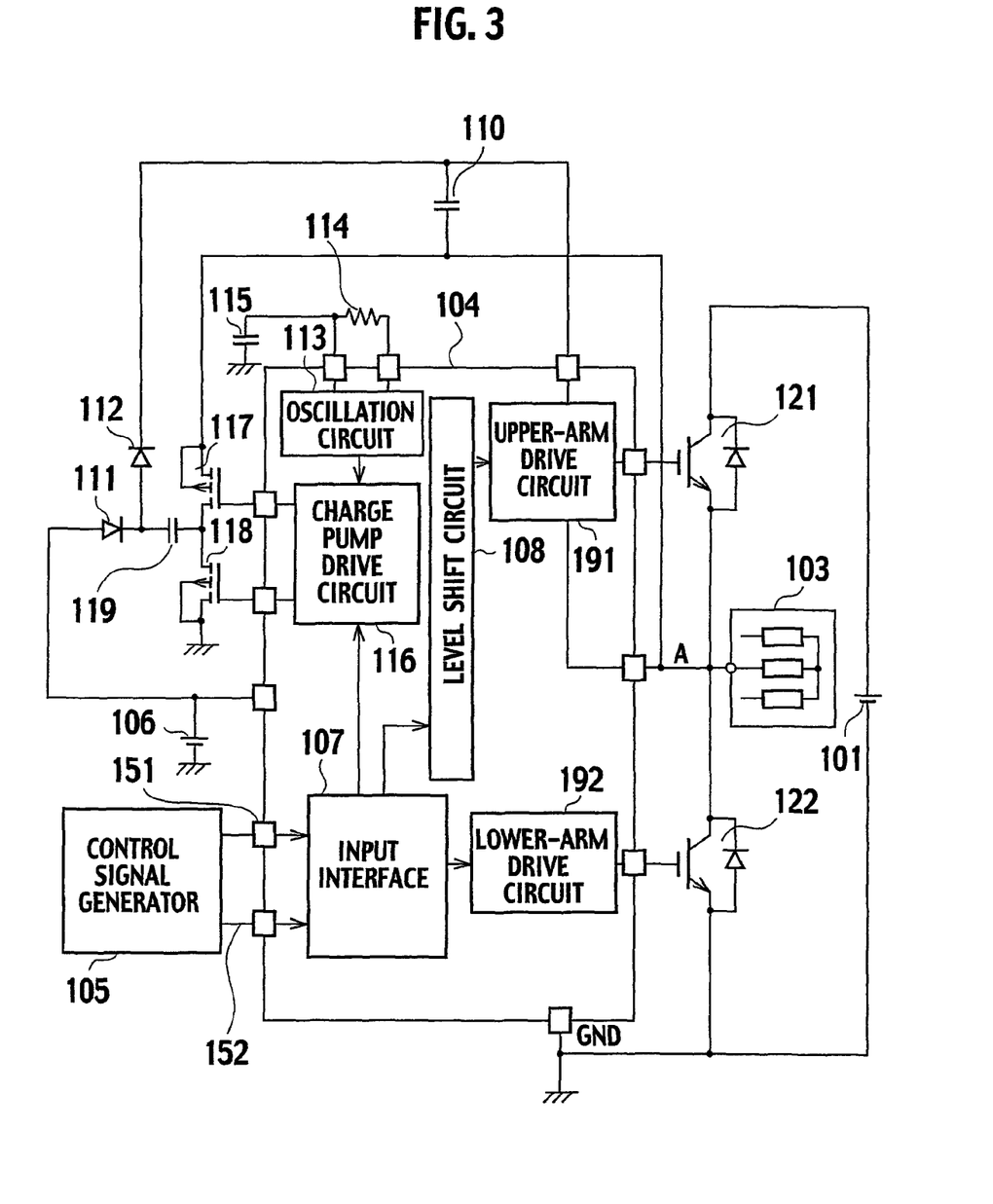
FIG. 3 is a circuit diagram showing a conventional gate drive circuit.

FIG. 3 is a circuit diagram showing the gate drive circuit of the related art. Operation of the gate drive circuit will be explained. When a lower-arm switching element 122 turns on, a bootstrap charge circuit is formed. Namely, a power source capacitor 110 of an upper arm circuit is charged through a charging path extending along a power source 106, high-voltage diodes 111 and 112, the power source capacitor 110 of the upper arm circuit, a connection point A of the switching elements 121 and 122, the lower-arm switching element 122, and a ground.

When the upper-arm switching element 121 turns on, a potential at the point A increases nearly to the voltage of a DC power source 101. At this time, an oscillation circuit 113 operates. According to an output from the oscillation circuit 113, a charge pump drive circuit 116 alternately turns on/off switching elements 117 and 118. At ON-timing of the switching element 118, the power source 106 charges an auxiliary capacitor 119 through a path extending along the diode 111, auxiliary capacitor 119, and switching element 118. Then, the switching element 118 turns off and the switching element 117 turns on. The charged auxiliary capacitor 119 charges the power source capacitor 110 of the upper-arm circuit through a path extending along the high-voltage diode 112, power source capacitor 110, and switching element 117.

In this way, when the low-side switching element 122 is OFF, the charge pump drive circuit 116 charges the power source capacitor 110 of the bootstrap circuit.

DISCLOSURE OF THE INVENTION

Problems to be Solved by the Invention

According to the drive circuit shown in FIG. 1, the bootstrap circuit 50 charges the capacitor C2 when the low-side switching element QL is ON. Therefore, if an ON-time of the switching element QL is short, the capacitor C2 is insufficiently charged to thereby drop a voltage. This causes a shortage of source voltage for the high-side drive circuit 70.

To meet recent requirements for lower power consumption, in particular, power reduction during a standby state, switching power sources frequently employ efficiency improving techniques such as intermittently conducting an ON/OFF operation of switching circuits if power consumption is small during, for example, a standby state. During a period in which the ON/OFF operation of the switching circuit is inoperative, the bootstrap circuit 50 is inactive to drop the voltage of the capacitor C2 to thereby cause a shortage of source voltage for the high-side drive circuit 70.

According to the gate drive circuit disclosed in the above-mentioned document, the power source capacitor 110 of the high-side drive circuit is charged by the bootstrap circuit when the low-side (lower-arm side) switching element 122 is ON, and when the low-side switching element 122 is OFF (when the high-side switching element 121 is ON), is charged by the charge pump drive circuit 116. Accordingly, when the power source capacitor 110 is charged by the bootstrap circuit, it is impossible to optionally set a charge time of the power source capacitor 110.

In addition, the drive circuit employs diodes of high withstand voltage, and therefore, is hardly integrated into a monolithic IC.

According to the present invention, there is provided a drive circuit capable of always supplying a predetermined voltage as a source voltage for a high-side drive circuit without regard to the state of a low-side switching element.

Means for Solving the Problems

In order to solve the above-mentioned problems, the present invention employs techniques mentioned below.

According to a first technical aspect of the present invention, there is provided a drive circuit having a high-side drive circuit configured to turn on/off, according to a control signal, a first switching element arranged on a high side of a DC power source and a low-side drive circuit configured to turn on/off a second switching element alternately with the first switching element according to the control signal in which the second switching element is arranged on a low side of the DC power source and is connected in series with the first switching element. The drive circuit also includes a first series circuit connected to both ends of a first auxiliary power source and including a first switch element, a first capacitor, and a second switch element those are connected in series; a second series circuit connected to both ends of the first capacitor and including a third switch element, a second capacitor, and a fourth switch element those are connected in series; and a control circuit to alternately turn on/off the first and second switch elements and the third and fourth switch elements in such a manner as to turn on the first and second switch elements and then the third and fourth switch elements. The second capacitor provides the high-side drive circuit with source power.

According to a second technical aspect of the present invention, the first and second switch elements are n-channel FETs, respectively, a back gate of each of the n-channel FETs being connected to a reference potential; the third and fourth switch elements are p-channel FETs; a fifth switch element made of a p-channel FET is arranged so that a source thereof is connected to a back gate of the third switch element and a drain thereof is connected to a drain of the third switch element; the control circuit alternately turns on/off the first and second switch elements and the third to fifth switch elements in such a manner as to turn on the first and second switch elements, then the third and fifth switch elements, and thereafter, the fourth switch element.

According to a third technical aspect of the present invention, the drive circuit further includes a first resistor having an end connected to the source of the fifth switch element and another end connected to an end of the second capacitor and a source of the third switch element.

According to a fourth technical aspect of the present invention, the drive circuit further includes a second auxiliary power source to charge the second capacitor through a diode, a back gate of the fourth switch element being connected to the second capacitor.

According to a fifth technical aspect of the present invention, the voltage of the first auxiliary power source is larger than the voltage of the second auxiliary power source.

According to a sixth technical aspect of the present invention, a second resistor is connected between the back gate of the fourth switch element and the second capacitor.

BEST MODE FOR CARRYING OUT THE INVENTION

First Embodiment

Drive circuits according to embodiments of the present invention will be explained in detail with reference to the drawings.

Figure 4:
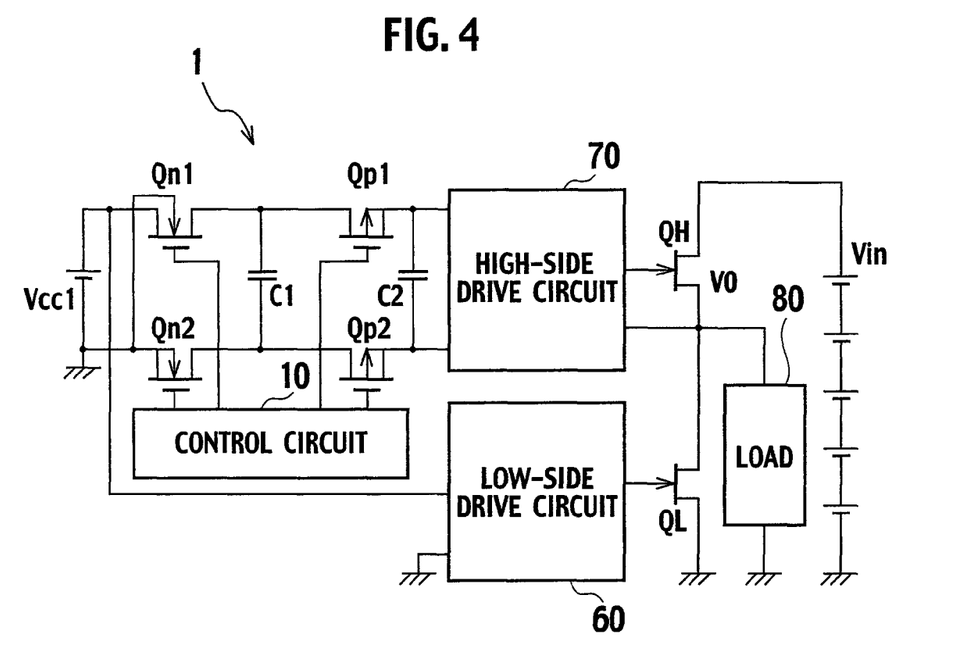
FIG. 4 is a circuit diagram showing a drive circuit according to a first embodiment of the present invention.

FIG. 4 is a circuit diagram showing a drive circuit according to the first embodiment of the present invention. In FIG. 4, both ends of a DC power source Vin are connected in series with a MOSFET serving as a switching element QH and a MOSFET serving as a switching element QL. A connection point between the switching element QH and the switching element QL is connected to a load 80.

Based on a signal from a control circuit that is not shown, a low-side drive circuit 60 turns on/off the switching element QL. Based on the signal from the control circuit that is not shown, a high-side drive circuit 70 turns on/off the switching element QH complementarily to the switching element QL. Namely, the switching element QH and switching element QL are alternately turned on/off.

The low-side drive circuit 60 operates with an auxiliary power source Vcc1 (first auxiliary power source). The high-side drive circuit 70 operates with the voltage of a capacitor C2 charged by a high-side power supply unit 1.

In the high-side power supply unit 1, a positive pole of the auxiliary power source Vcc1 is connected to a drain of a switch element Qn1 (first switch element). A source of the switch element Qn1 is connected to a first end of a capacitor C1 (first capacitor). A second end of the capacitor C1 is connected to a drain of a switch element Qn2 (second switch element). The source and back gate of the switch element Qn2 are connected to a negative pole (ground GND) of the auxiliary power source Vcc1. A back gate of the switch element Qn1 is connected to the negative pole (ground GND) of the auxiliary power source Vcc1. Namely, the ends of the auxiliary power source Vcc1 are connected in series with the switch element Qn1, capacitor C1, and switch element Qn2.

The first end of the capacitor C1 is connected to a drain of a switch element Qp1 (third switch element). The source and back gate of the switch element Qp1 are connected to a first end of the capacitor C2 (second capacitor) and a first end of the high-side drive circuit 70. The second end of the capacitor C1 is connected to a drain of a switch element Qp2 (fourth switch element). The source and back gate of the switch element Qp2 are connected to a second end of the capacitor C2 and a second end of the high-side drive circuit 70. Namely, the ends of the capacitor C1 are connected in series with the switch element Qp1, capacitor C2, and switch element Qp2.

The switch elements Qn1 and Qn2 are each n-channel MOSFET. The back gate of each of the n-channel FETs is connected to a low-side reference potential (e.g. ground GND). The switch elements Qp1 and Qp2 are p-channel MOSFETs.

The high-side power supply unit 1 has a control circuit 10 that applies control signals to the gates of the switch elements to turn on the switch elements Qn1 and Qn2 and then turn on the switch elements Qp1 and Qp2. The capacitor C2 serves as a power source for the high-side drive circuit 70.

Figure 5:
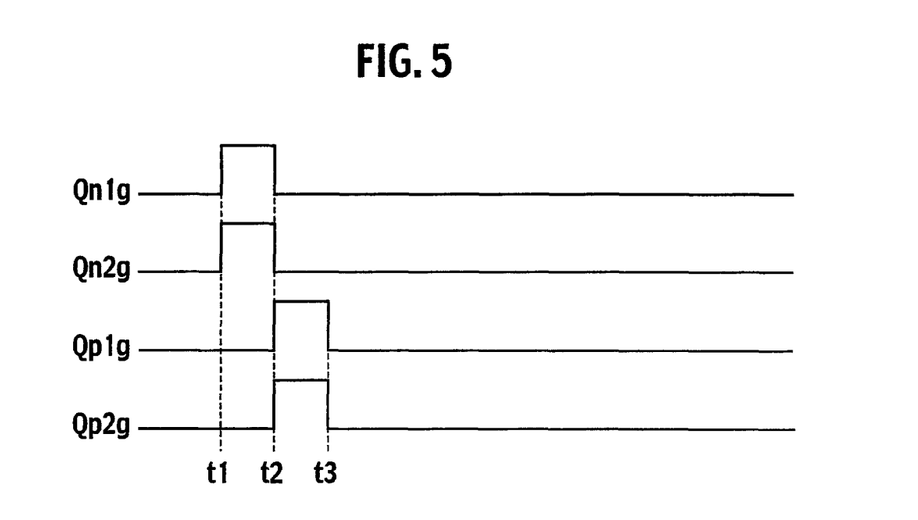
FIG. 5 is a timing chart showing signals from a control circuit arranged in the drive circuit according to the first embodiment of the present invention.

Operation of the drive circuit according to the first embodiment having the above-mentioned configuration will be explained with reference to the timing chart shown in FIG. 5.

At time t1, a gate signal Qn1g is applied to the gate of the switch element Qn1 and a gate signal Qn2g to the gate of the switch element Qn2, to turn on the switch elements Qn1 and Qn2 and off the switch elements Qp1 and Qp2 (by negating gate signals Qp1g and Qp2g).

At this time, the auxiliary power source Vcc1 charges the capacitor C1 through a path extending along Vcc1, Qn1, C1, Qn2, and Vcc1, so that the voltage of the capacitor C1 reaches the voltage of the auxiliary power source Vcc1. At this time, the switch elements Qp1 and Qp2 are OFF, and therefore, the auxiliary power source Vcc1 charges the capacitor C1 independently of a high-side reference potential.

At time t2, the switch elements Qn1 and Qn2 are turned off and the gate signal Qp1g is applied to the gate of the switch element Qp1 and the gate signal Qp2g to the gate of the switch element Qp2, to turn on the switch elements Qp1 and Qp2.

At this time, the capacitor C2 is charged through a path along C1, Qp1, C2, Qp2, and C1. Namely, the charge of the capacitor C1 moves to the capacitor C2, to charge the capacitor C2 until the capacitor C2 reaches the voltage of the capacitor C1. The capacitor C2 serves as a power source for the high-side drive circuit 70.

Consequently, the capacitor C2 supplies charge to operate the high-side drive circuit 70. At this time, the switch elements Qn1 and Qn2 are OFF, and therefore, the charge of the capacitor C1 moves to the capacitor C2 without regard to the high-side reference potential.

Alternately turning on/off the switch elements Qn1 and Qn2 and the switch elements Qp1 and Qp2 without regard to the high-side reference potential (without regard to whether the low-side switching element QL is ON or OFF) can charge the capacitor C2 through the capacitor C1 by the voltage of the auxiliary power source Vcc1 at predetermined intervals.

According to the present invention, the ON/OFF operation of the switch elements Qn1 and Qn2 and the switch elements Qp1 and Qp2 can be set without restriction by operation of the switching elements QH and QL. When charging the capacitor C1 from the auxiliary power source Vcc1 or when charging the capacitor C2 from the capacitor C1, an impedance element may be inserted to limit a charge current so that a charge voltage of the capacitor C1 or C2 changes depending on a charge time. Then, by setting ON/OFF duty factors of the switch elements Qn1 and Qn2 and the switch elements Qp1 and Qp2, the voltage of the capacitor C1 or C2 is adjustable. The ON/OFF duty factors of the switch elements Qn1 and Qn2 and the switch element Qp1 and Qp2 can be adjusted by detecting a voltage of the capacitor, to stabilize the voltage.

Second Embodiment

In the drive circuit according to the first embodiment shown in FIG. 4, the switch element Qp1 reversely passes a current from the drain to the source. In addition, the switch element Qp1 must have a high withstand voltage.

Figure 6:
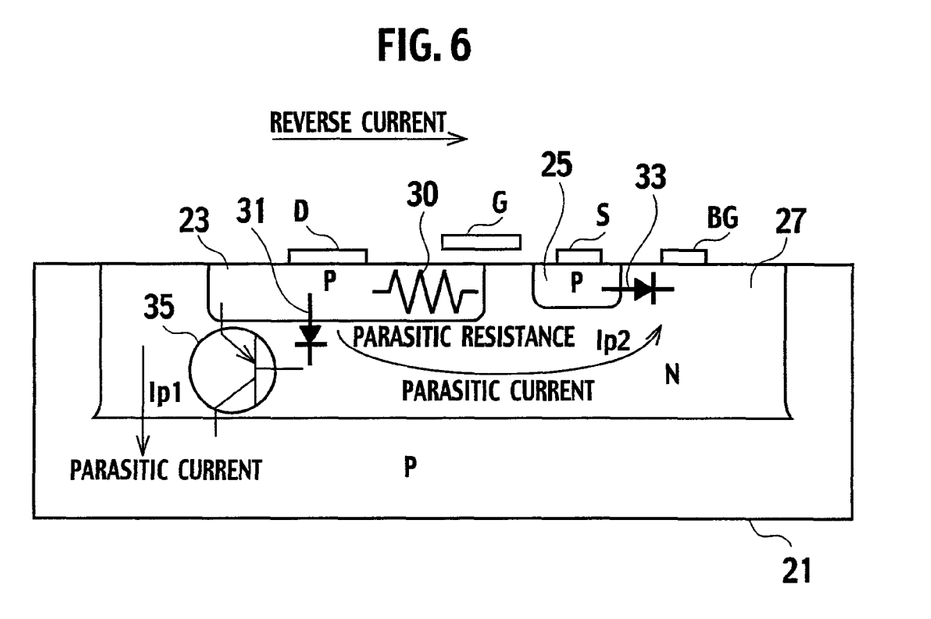
FIG. 6 is a typical structural view showing a third switch element made of a p-channel FET arranged in the drive circuit according to the first embodiment of the present invention, the third switch element being mounted on a high-withstand-voltage integrated circuit.

FIG. 6 is a typical structural view of the second embodiment showing a p-channel FET as the switch element Qp1 arranged in the drive circuit according to the first embodiment of the present invention in which the switch element is mounted on a high-withstand-voltage integrated circuit. As shown in FIG. 6, the switch element Qp1 has a p-layer 21, the drain D, the source S, and the back gate BG. In a peripheral region of the drain D, a p-layer 23 is formed, and in a peripheral region of the source S, a p-layer 25 is formed. Among the p-layers 21, 23, and 25, an n-layer 27 is formed.

As shown in FIG. 6, there are a parasitic resistance 30 of the drain D, a parasitic diode 31 between the p-layer 23 and the n-layer 27, a parasitic diode 33 between the p-layer 25 and the n-layer 27, and a parasitic transistor 35 among the p-layer 23, n-layer 27, and p-layer 21. If a large current passes through the switching element, the drain parasitic resistance 30 of the switch element Qp1 causes a voltage drop to operate the parasitic transistor 35 that is equivalent to a pnp transistor with the n-layer 27 serving as a base layer. The parasitic transistor 35 passes a parasitic current Ip1 from the p-layer 23 to the p-layer 21, and the parasitic diode 31 passes a parasitic current Ip2 from the p-layer 23 to the back gate BG through the n-layer 27, to hinder an objective operation.

When an operating temperature is high, a base-emitter voltage of the parasitic transistor 35 decreases to increase the parasitic resistance 30 of the drain, so that the parasitic transistor 35 may easily operate. As a result, conditions of use of the p-channel FET are limited to a smaller current density. If the withstand voltage of the parasitic transistor 35 of the switch element Qp1 is low, the element will be broken. Reducing the parasitic resistance 30 of the drain and increasing the withstand voltage of the parasitic transistor 35 result in enlarging a chip size when integrated into a monolithic IC.

Figure 7:
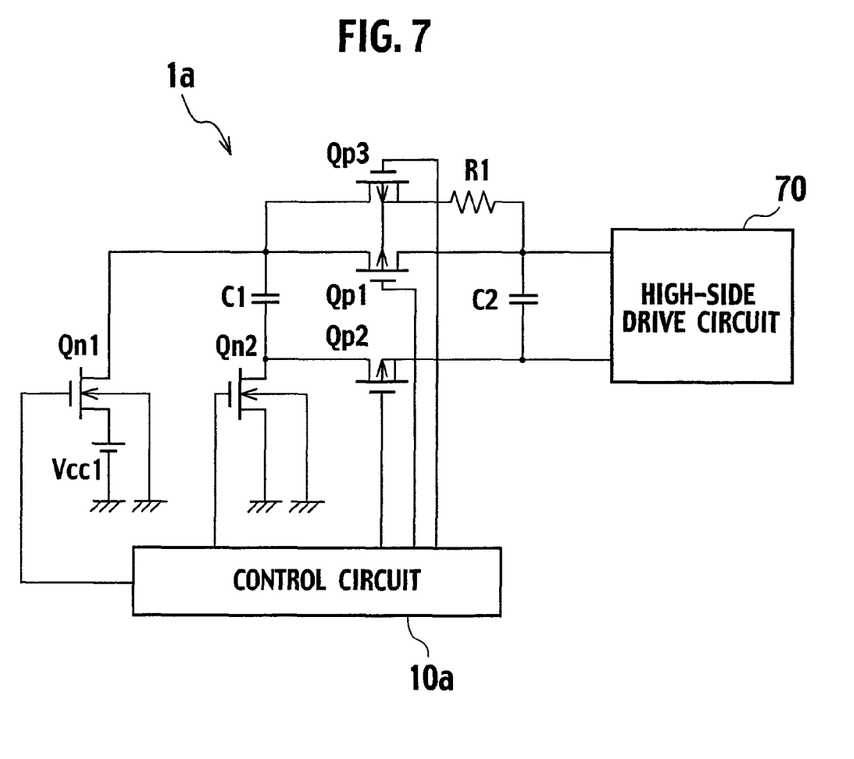
FIG. 7 is a circuit diagram showing a drive circuit according to a second embodiment of the present invention.

This embodiment provides a drive circuit that is free from the influence of the parasitic transistor 35 and is easy to be integrated into a monolithic IC. FIG. 7 is a circuit diagram showing the drive circuit according to the second embodiment of the present invention. FIG. 7 shows essential parts of the drive circuit, i.e., a high-side drive circuit 70 and a power supply unit 1a. The other parts are the same as those of the first embodiment shown in FIG. 4.

The high-side power supply unit 1a shown in FIG. 7 has a p-channel MOSFET as a switch element Qp3 (fifth switch element) in addition to the configuration of the high-side power supply unit 1 shown in FIG. 4.

A drain of the switch element Qp3 is connected to a drain of a switch element Qp1 and source and back gate thereof are connected to a back gate of the switch element Qp1 and also through a resistor R1 (first resistor) to a source of the switch element Qp1 and a first end of a capacitor C2.

A control circuit 10a applies control signals to the gates of the switch elements, to turn on switch elements Qn1 and Qn2, then the switch elements Qp1 and Qp3, and thereafter, the switch element Qp2. The capacitor C2 serves as a power source for the high-side drive circuit 70.

Figure 8:
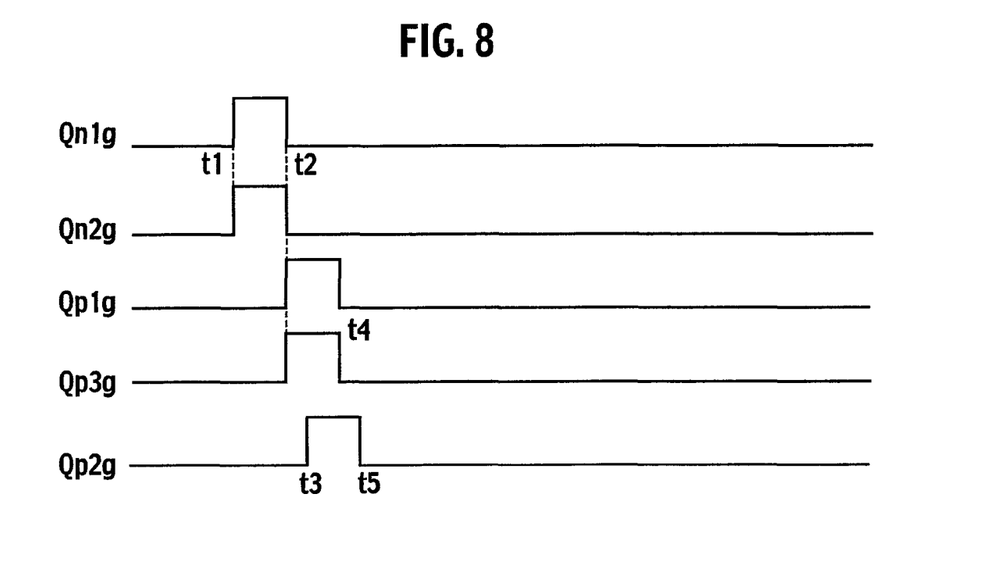
FIG. 8 is a timing chart showing signals from a control circuit arranged in the drive circuit according to the second embodiment of the present invention.

Operation of the drive circuit according to the second embodiment having such a configuration will be explained with reference to the timing chart shown in FIG. 8.

At time t1, a gate signal Qn1g is applied to the gate of the switch element Qn1 and a gate signal Qn2g to the gate of the switch element Qn2, to turn on the switch elements Qn1 and Qn2 and turn off the switch elements Qp1 and Qp2.

At this time, an auxiliary power source Vcc1 charges a capacitor C1 through a path along Vcc1, Qn1, C1, Qn2, and Vcc1, so that the voltage of the capacitor C1 reaches the voltage of the auxiliary power source Vcc1. At this time, the switch elements Qp1 and Qp2 are OFF, and therefore, the auxiliary power source Vcc1 charges the capacitor C1 without regard to a high-side reference potential.

At time t2, the switch elements Qn1 and Qn2 are turned off, a gate signal Qp1g is applied to the gate of the switch element Qp1 and a gate signal Qp3g to the gate of the switch element Qp3, to turn on the switch elements Qp1 and Qp3. It is preferable to turn on the switch element Qp1 slightly earlier than the switch element Qp3. At time t3, the switch element Qp2 is turned on.

At this time, a current passes through the drain of the switch element Qp1 and the source thereof and a parasitic resistance of the drain causes a voltage drop. The switch element Qp3 is ON, however, to fix the back gate of the switch element Qp1 at a drain voltage. Namely, the source of the switch element Qp3 and the back gate of the switch element Qp1 are at the same potential. When the switch element Qp3 is ON, the drain and source of the switch element Qp3 are at the same potential and the drain of the switch element Qp3 and the drain of the switch element Qp1 are at the same potential. Accordingly, the back gate and drain of the switch element Qp1 are at the same potential. As a result, the parasitic diodes 31 and 33 and parasitic transistor 35 never become operative.

The switch element Qp3 is arranged to fix the back gate of the switch element Qp1 at the drain of the switch element Qp1, and therefore, is not required to pass a large current. Due to this, the resistor R1 limits the current. The switch element Qp3 is limited by the resistor R1 not to pass a large current, and therefore, no parasitic diode or parasitic transistor operates. The capacitor C1 charges the capacitor C2 through a path along C1, Qp1, C2, Qp2, and C1. Namely, the charge of the capacitor C1 moves to the capacitor C2, which is charged until the voltage of the capacitor C2 reaches the voltage of the capacitor C1.

Third Embodiment

Figure 9:
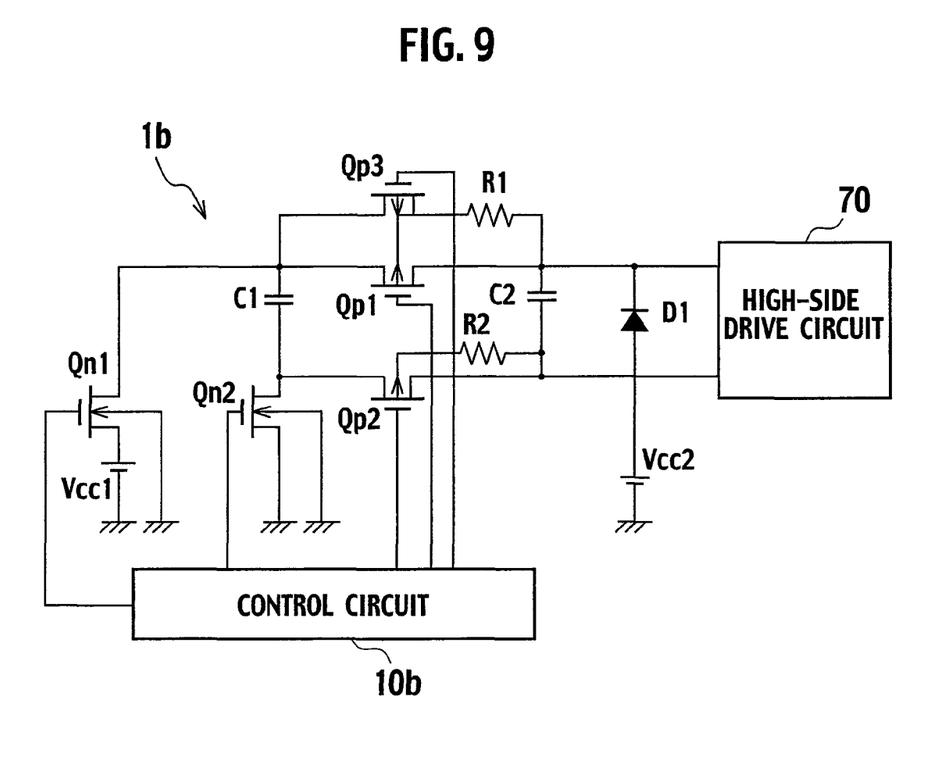
FIG. 9 is a circuit diagram showing a drive circuit according to a third embodiment of the present invention.

FIG. 9 is a circuit diagram showing a drive circuit according to the third embodiment of the present invention. According to the first and second embodiments, a large charge current passes when the voltage of the capacitor C2 is low at the time of, for example, starting. To withstand this, the switch elements Qn1, Qn2, Qp1, and Qp2 must have large rated capacities.

The drive circuit of this embodiment is, as shown in FIG. 9, a combination of a bootstrap circuit and the drive circuit of the second embodiment and is characterized in that it needs no large rated capacities and can easily be integrated into a monolithic IC.

In addition to the drive circuit of the second embodiment shown in FIG. 7, the drive circuit of the third embodiment connects an auxiliary power source Vcc2 (second auxiliary power source) through a diode D1 to a first end of a capacitor C2, to charge the capacitor C2. The voltage of the auxiliary power source Vcc2 is set to be lower than the voltage of an auxiliary power source Vcc1. A back gate of a switch element Qp2 is connected through a resistor R2 (second resistor) to a second end of the capacitor C2.

According to the drive circuit of the third embodiment with the above-mentioned configuration, the auxiliary power source Vcc2 and diode D1 operate like a conventional bootstrap circuit at the time of starting. When a low-side switching element QL is ON, the auxiliary power source Vcc2 rapidly charges the capacitor C2 through the diode D1, to operate a switching circuit consisting of the switching elements QH and QL.

Thereafter, switch elements Qn1 and Qn2 and switch elements Qp1 and Qp2 are turned on/off, to charge the capacitor C2 from the auxiliary power source Vcc1 through a capacitor C1.

The auxiliary power source Vcc1 is larger than the auxiliary power source Vcc2. When the charging by the auxiliary power source Vcc1 starts, the voltage of the capacitor C2 becomes higher than the voltage of the auxiliary power source Vcc2, to terminate the charging by the bootstrap circuit. The charging of the capacitor C2 by turning on/off the switch elements Qn1 and Qn2 and the switch elements Qp1 and Qp2 is required only to supplement power consumed by the drive circuit, and therefore, the switch elements Qn1, Qn2, Qp1, and Qp2 can be FETs of small rated capacities.

The resistor R2 can limit a current passed from the switch element Qp2 to the capacitor C2.

EFFECT OF THE INVENTION

According to the first technical aspect of the present invention, the second capacitor can be charged at predetermined intervals without regard to the state of the second switching element on the low side. When used as a power source for the high-side drive circuit, the second capacitor can supply a source voltage that is always at a predetermined level to the high-side drive circuit without regard to the state of the second switching element on the low side.

According to the second technical aspect of the present invention, FETs are used as the switch elements and a back gate is used to reversely bias parasitic diodes. As a result, no parasitic transistor operates, a high withstand voltage is realized, and a monolithic IC can easily be realized.

According to the third technical aspect of the present invention, the first resistor can limit a current passed to the fifth switch element.

According to the fourth and fifth technical aspects of the present invention, the bootstrap circuit quickly charges the second capacitor. Thereafter, it is charged only for consumed power. This can reduce power supply and easily realize a monolithic IC.

According to the sixth aspect of the present invention, the second resistor can limit a current passed to the fourth switch element.

INDUSTRIAL APPLICABILITY

The present invention is applicable to drive circuits for driving switching circuits of DC-DC converters, inverters, motor drive circuits, and the like.

US DESIGNATION

In connection with US designation, this application claims the benefit of priority under U.S. Patent Law 119(a) of Japanese Patent Application No. 2005-184872 (24.06.2005) filed on Jun. 24, 2005, and the disclosed contents thereof are incorporated herein by reference.

The invention claimed is:

1. A drive circuit having a high-side drive circuit configured to turn on/off, according to a control signal, a first switching element arranged on a high side of a DC power source and a low-side drive circuit configured to turn on/off a second switching element alternately with the first switching element according to the control signal, the second switching element being arranged on a low side of the DC power source and being connected in series with the first switching element, comprising:

a first series circuit connected to both ends of a first auxiliary power source and including a first switch element, a first capacitor, and a second switch element those are connected in series;

a second series circuit connected to both ends of the first capacitor and including a third switch element, a second capacitor, and a fourth switch element those are connected in series; and a control circuit configured to alternately turn on/off the first and second switch elements and the third and fourth switch elements in such a manner as to turn on the first and second switch elements and then the third and fourth switch elements, wherein the second capacitor provides the high-side drive circuit with source power.

2. The drive circuit as set forth in claim 1, wherein:

the first and second switch elements are n-channel FETs, respectively, a back gate of each of the n-channel FETs is connected to a reference potential;

the third and fourth switch elements are p-channel FETS;

a p-channel FET as a fifth switch element is arranged so that a source thereof is connected to a back gate of the third switch element and a drain thereof is connected to a drain of the third switch element; and the control circuit alternately turns on/off the first and second switch elements and the third to fifth switch elements in such a manner as to turn on the first and second switch elements, then the third and fifth switch elements, and thereafter, the fourth switch element.

3. The drive circuit according to claim 2, further comprising:

a first resistor having an end connected to the source of the fifth switch element and another end connected to an end of the second capacitor and a source of the third switch element.

4. The drive circuit according to claim 2, further comprising:

a second auxiliary power source configured to charge the second capacitor through a diode; and a back gate of the fourth switch element being connected to the second capacitor.

5. The drive circuit according to claim 3, further comprising:

a second auxiliary power source configured to charge the second capacitor through a diode; and a back gate of the fourth switch element being connected to the second capacitor.

6. The drive circuit according to claim 4, wherein the voltage of the first auxiliary power source is larger than the voltage of the second auxiliary power source.

7. The drive circuit according to claim 5, wherein the voltage of the first auxiliary power source is larger than the voltage of the second auxiliary power source.

8. The drive circuit according to claim 4, wherein a second resistor is connected between the back gate of the fourth switch element and the second capacitor.

9. The drive circuit according to claim 5, wherein a second resistor is connected between the back gate of the fourth switch element and the second capacitor.

* * * * *